United States Patent
Hossain et al.

(10) Patent No.: US 11,846,738 B2
(45) Date of Patent: Dec. 19, 2023

(54) RADIATION DETECTION SYSTEMS AND METHODS

(71) Applicant: CERIUM LABORATORIES LLC, Austin, TX (US)

(72) Inventors: Tim Z Hossain, Austin, TX (US); Mark Clopton, Austin, TX (US); Clayton Fullwood, Austin, TX (US)

(73) Assignee: CERIUM LABORATORIES LLC, Austin, TX (US)

( * ) Notice: Subject to any disclaimer, the term of this patent is extended or adjusted under 35 U.S.C. 154(b) by 110 days.

(21) Appl. No.: 17/605,070

(22) PCT Filed: Apr. 22, 2020

(86) PCT No.: PCT/US2020/029369
§ 371 (c)(1),
(2) Date: Feb. 22, 2022

(87) PCT Pub. No.: WO2020/226900
PCT Pub. Date: Nov. 12, 2020

(65) Prior Publication Data
US 2022/0206170 A1    Jun. 30, 2022

Related U.S. Application Data

(60) Provisional application No. 62/837,286, filed on Apr. 23, 2019.

(51) Int. Cl.
*G01T 1/24* (2006.01)
(52) U.S. Cl.
CPC ............. *G01T 1/243* (2013.01); *G01T 1/242* (2013.01)

(58) Field of Classification Search
CPC ................................ G01T 1/243; G01T 1/242
See application file for complete search history.

(56) References Cited

U.S. PATENT DOCUMENTS

| | | |
|---|---|---|
| 5,523,597 A | 6/1996 | Baumann et al. |
| 6,075,261 A | 6/2000 | Hossain et al. |
| 6,097,079 A | 8/2000 | Hossain et al. |
| 7,525,141 B1 | 4/2009 | Forbes et al. |
| 7,847,386 B1 | 12/2010 | Kim et al. |
| 7,902,520 B2 | 3/2011 | Hossain et al. |
| 8,222,704 B2 | 7/2012 | Manning et al. |
| 8,310,864 B2 | 11/2012 | Lung et al. |
| 8,436,289 B1 | 5/2013 | Hossain et al. |
| 8,748,800 B2 | 6/2014 | Hossain et al. |
| 8,803,066 B2 | 8/2014 | Hossain et al. |

(Continued)

FOREIGN PATENT DOCUMENTS

| CN | 110011946 B | 3/2020 |
|---|---|---|
| WO | 2020226900 A2 | 11/2020 |

*Primary Examiner* — Hugh Maupin

(57) ABSTRACT

A method of forming a radiation detector includes forming a stack including a plurality of arrays of radiation detection devices. Forming an array of the plurality of arrays includes forming a polysilicon layer over an interlayer dielectric layer of another array of the plurality of arrays; forming charge storage layers over the polysilicon layer; forming a second polysilicon layer over the charge storage layers; etching the second polysilicon layer to form gate stacks; and depositing an interlayer dielectric disposed on at least three sides of the gate stacks, the interlayer dielectric including a radiation reactive material.

20 Claims, 10 Drawing Sheets

(56) References Cited

U.S. PATENT DOCUMENTS

| | | |
|---|---|---|
| 9,575,018 B2 | 2/2017 | Hossain |
| 2005/0258373 A1 | 11/2005 | Lacy |
| 2006/0245235 A1* | 11/2006 | Krieger .............. G11C 13/0009 |
| | | 365/115 |
| 2009/0166550 A1* | 7/2009 | Gazda ....................... G01T 3/08 |
| | | 250/392 |
| 2010/0155611 A1 | 6/2010 | Fullwood et al. |
| 2010/0230772 A1* | 9/2010 | Cannon ................. H01L 23/552 |
| | | 257/E31.113 |
| 2011/0220805 A1* | 9/2011 | Gordon ................. H01L 31/119 |
| | | 257/324 |
| 2011/0220806 A1 | 9/2011 | Gordon |
| 2013/0193537 A1* | 8/2013 | Hossain ............ H01L 27/14676 |
| | | 257/429 |
| 2016/0238580 A1* | 8/2016 | Kundalgurki ........ G01N 27/228 |
| 2018/0096936 A1* | 4/2018 | Wu .................... H01L 27/14643 |
| 2020/0013758 A1* | 1/2020 | Shizukuishi .......... H01L 27/144 |
| 2020/0073758 A1 | 3/2020 | Shizukuishi |
| 2020/0241149 A1* | 7/2020 | Yau ..................... H01L 29/7869 |

\* cited by examiner

RADIATION DETECTION SYSTEMS AND METHODS

CROSS-REFERENCE TO RELATED APPLICATION(S)

This application is a 371 of International Application No. PCT/US20/29369, filed Apr. 22, 2020, which claims benefit of U.S. Provisional Application No. 62/837,286, filed Apr. 23, 2019, each of which is incorporated herein by reference in its entirety.

FIELD OF THE DISCLOSURE

This disclosure, in general, relates to systems and methods for detecting ionizing radiation.

BACKGROUND

With the occurrence of highly publicized terrorist events, concern for control of hazardous materials, particularly radioactive sources, is high. In particular, sources of neutron radiation are of particular concern. Fissile material can be used to make dirty bombs or nuclear weapons, which if used, could cause extensive loss of life and property damage.

However, conventional methods for detecting neutron radiation suffer from sensitivity to gamma radiation and high cost. Conventional technologies for detecting radiation are expensive and cumbersome. Large and expensive equipment is used at major ports to test for the presence of radioactive material. On the other extreme, smaller handheld devices with low sensitivity are available.

As such, a less expensive and more accurate solution would be desirable.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

In an exemplary embodiment, a radiation detection system includes an array of radiation detection devices. The devices can be formed using methods similar to those methods used to form memory devices, such as Mirrorbit™ devices. The detection devices include charge storage regions to store a charge above a voltage threshold. When a neutron interacts with a radiation reactive material, the neutron causes a nucleus fission that releases an alpha particle. The alpha particle can disturb the charge stored in the charge storage region, resulting in the stored charge falling below the voltage threshold. When the charge stored in the charge storage region is above the threshold, current through the device can be limited, referred to herein as a "0" state. When the charge drops below the voltage threshold, indicating a detection event, a higher current can flow through the device, referred to herein as a "1" state.

In an example, a device includes a gate structure formed over a substrate. In particular, the gate structure can be formed over a portion of the substrate between source and drain regions. The gate structure can include a charge storage structure that, for example, includes a layer of an oxide of silicon disposed on a layer of a nitride of silicon disposed on a layer of an oxide of silicon. Within the gate structure, one or more conductive layers can optionally be disposed adjacent to the charge storage structure. In an example, the conductive layer is a polysilicon layer disposed adjacent the charge storage structure. In an example, a neutron sensitive layer can be disposed around the polysilicon layer. For example, the neutron sensitive layer can be formed of a doped oxide layer, such as a layer doped with boron. In addition, the gate structure can include a gate oxide layer in direct contact with the substrate. The gate structure can further include sidewalls. Exemplary sidewalls can include a nitride of silicon. In particular, an insulative material filling the space between detection devices and surrounding the detection devices on at least three sides can be formed of a radiation reactive material.

Figure 1:
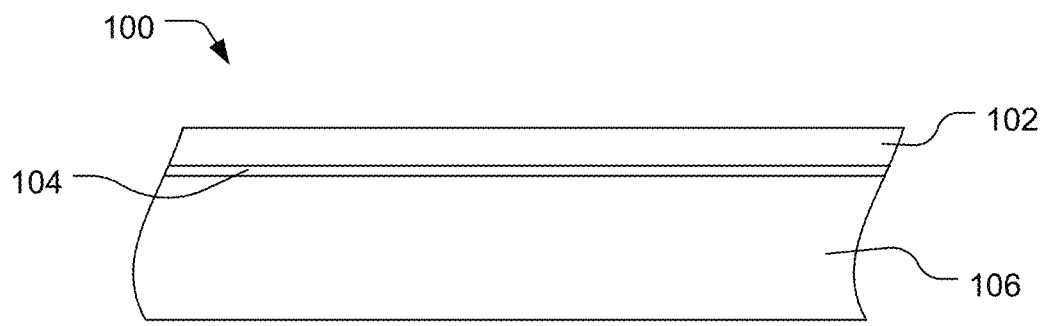
FIG. 1, FIG. 2, FIG. 3, FIG. 4, and FIG. 5 include illustrations of example workpieces for forming an embodiment of a detection device.

As illustrated in FIG. 1, an optional insulator layer 104 is disposed over a semiconductor substrate 106. In an example, the semiconductor substrate 106 can be formed of a semiconductor material, such as a silicon-based material, including silicon or silicon germanium, among others. In a particular example, the semiconductor substrate 106 is formed of monocrystalline silicon.

The optional insulator layer 104 is disposed over the semiconductor substrate 106 and can be in direct contact with the semiconductor substrate 106. In an example, the insulator layer 104 can be formed as an oxide grown from the semiconductor substrate. For example, the oxide can be grown in a furnace in an oxidative environment. Alternatively, the insulator layer 104 can include an insulator material, such as an oxide of silicon, hafnium silicon oxide, hafnium oxide, zirconium oxide, or another high-k dielectric material. A suitable deposition technique may be utilized to form the gate insulator layer 104, such as chemical vapor deposition (CVD), low-pressure chemical vapor deposition (LPCVD), and plasma enhanced chemical vapor deposition (PECVD). The gate insulator layer 104 is preferably deposited to a thickness of not greater than 10 nm, such as a thickness of not greater than 5 nm, or even not greater than 3 nm.

Depending on the nature of the device (e.g., P-MOS or N-MOS type devices), the substrate 106 can be treated to form desired p-type or n-type regions within the bulk material of the semiconductor layer 106. For example, the semiconductor substrate 106 can be treated with ion implantation to form wells or deep wells of the desired type depending upon the desired nature of the resulting devices. While embodiments described herein are described for the formation of P-MOS type devices, the process can be adapted to form N-MOS devices.

In a further example, an optional semiconductor layer 102 is optionally deposited over the gate insulator layer 104. In an example, the optional semiconductor layer 102 can include polycrystalline silicon, which can be doped to have desirable properties. For example, the semiconductor layer 102 can include phosphorus doped polycrystalline silicon. In an example, the polycrystalline silicon can be deposited as undoped polycrystalline silicon and subsequently doped by ion implantation. Alternatively, the polycrystalline silicon can be doped in situ. In an example, the polycrystalline silicon can be deposited using low-pressure chemical vapor deposition (LPCVD) with hydrogen reduction of silane. The polycrystalline layer can be deposited with a thickness in a range of 10 nm to 250 nm, such as a range of 20 nm to 220 nm, or even a range of 50 nm to 200 nm.

Figure 2:
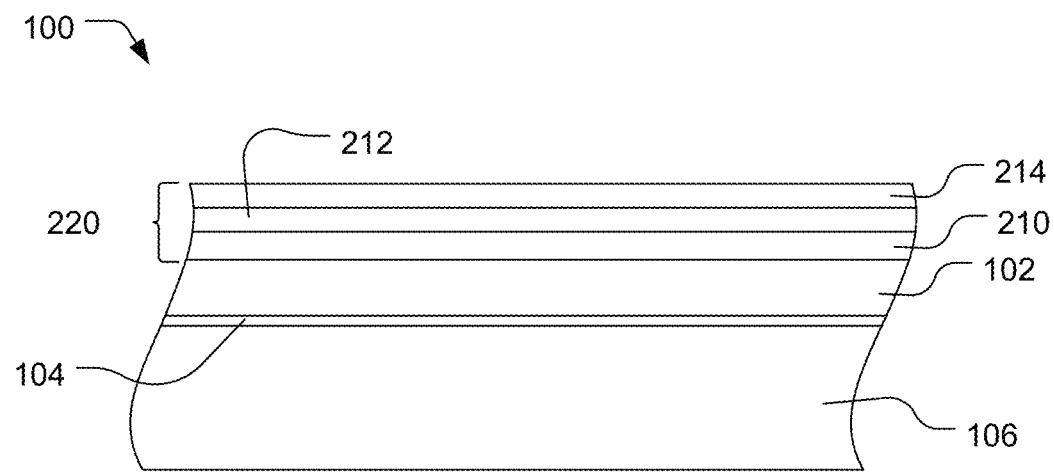

As illustrated in FIG. 2, a charge storage structure 220 is deposited adjacent the semiconductor layer 102. In particular, the charge storage structure can be deposited in direct contact with the semiconductor layer 102. In an example, the charge storage structure 220 can include more than two layers, such as three layers in which a layer of a nitride of silicon 212 is disposed between two layers (210 or 214) of oxides or oxynitrides of silicon. In an example, the charge storage structure 220 is formed by applying an oxide of silicon layer 210 over the semiconductor layer 102 using low-pressure chemical vapor deposition (LPCVD) in an oxygen-rich atmosphere. In particular, the oxide may be deposited using low-pressure chemical vapor deposition (LPCVD) of silane and nitrous oxide in a nitrogen atmosphere. The nitride layer 212 can also be deposited using low-pressure chemical vapor deposition (LPCVD) using hexamethyldisiloxane and ammonia gas, and an oxide or oxynitride layer 314 can be grown over the nitride layer 212 for example in an oxidation furnace.

The charge storage structure 220 can have a thickness in a range of 10 nm to 50 nm, such as a range of 10 nm to 30 nm. In particular, the oxide layer 210 can have a thickness in a range of 0.5 nm to 5 nm, such as a range of 1 nm to 4 nm, or even a range of 1 nm to 3 nm. The nitride layer 212 can have a thickness in a range of 3 nm to 10 nm, such as a range of 3 nm to 7 nm, or even a range of 4 nm to 6 nm. In a further example, the oxide layer 214 can have a thickness in a range of 2 nm to 20 nm, such as a range of 3 nm to 15 nm, or even a range of 5 nm to 10 nm.

Figure 3:
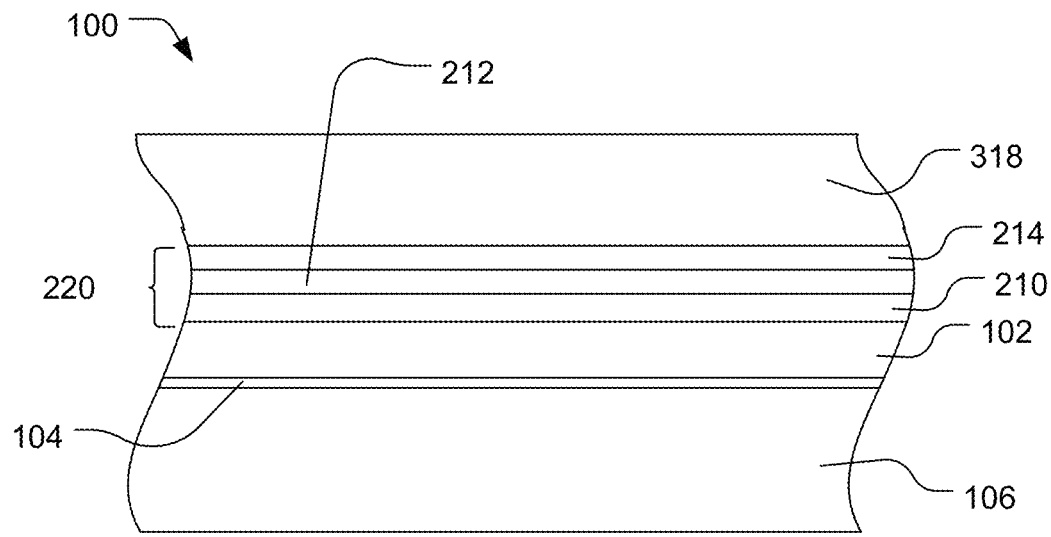
Figure 4:
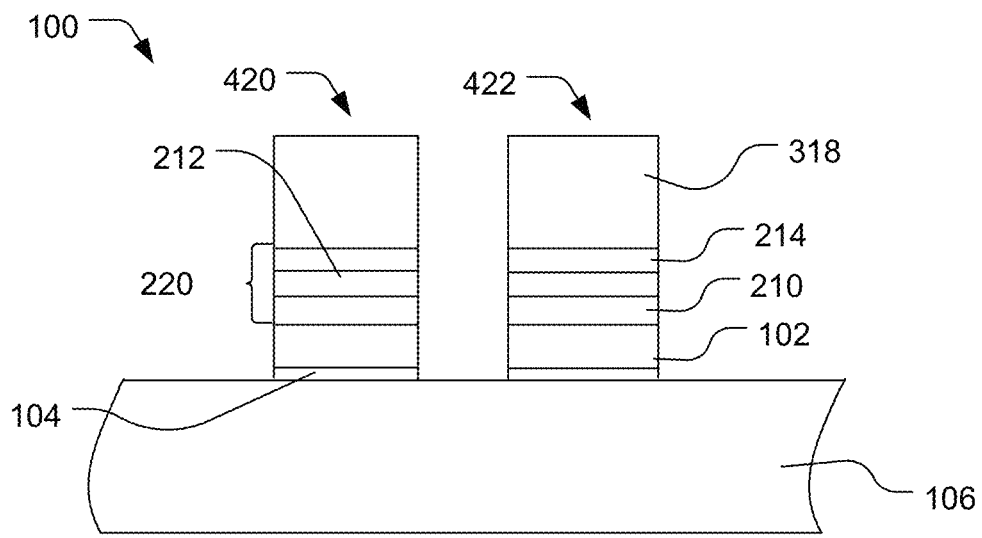

As illustrated in FIG. 3, an additional semiconductor layer 318 can be deposited over the charge storage structure 220. In an example, the semiconductor layer 318 can be deposited in direct contact with the charge storage structure 220. In an example, the semiconductor layer 318 includes polycrystalline silicon. The polycrystalline silicon can be deposited using CVD, LPCVD, or PECVD. The polycrystalline silicon can be doped to have a desired property. In an example, the thickness of the semiconductor layer 318 is in a range of 10 nm to 250 nm, such as a range of 20 nm to 220 nm, or even a range of 50 nm to 200 nm As illustrated in FIG. 4, the layers 102, 210, 212, 214, and 318 can be patterned and etched to form gate stacks, such as gate stacks 420 or 422. As such, the gate stacks can include the charge storage structures 220 optionally with one or more adjacent conductive layers (e.g., layers 102 or 318).

Figure 5:
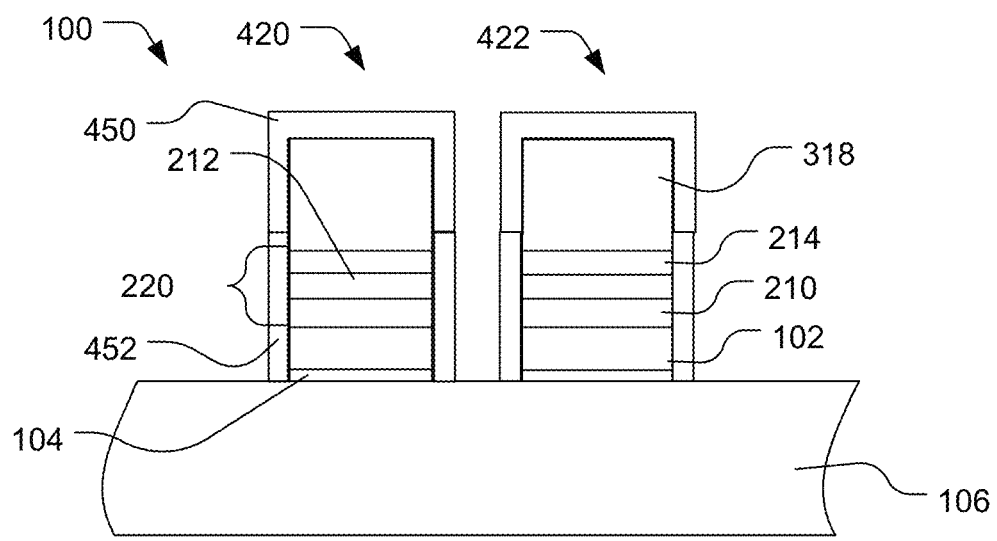

As illustrated in FIG. 5, a spacer or liner oxide can be formed around the gate structures. The space oxide can be formed as a unified structure. In another example, the space oxide can be formed as two structures. At least a portion of the space oxide surrounding the semiconductor layer 318 can be implanted to provide sensitivity to neutrons, such as thermal neutrons. For example, the spacer oxide 450 can be implanted with boron 10 ($^{10}$B). In an example, the spacer oxide 450 includes $^{10}$B in an amount in a range of $10^{16}$ to $10^{21}$ atoms/cm$^2$, such as a range of $3 \times 10^{16}$ to $10^{21}$ atoms/cm$^2$, a range of $10^{17}$ to $10^{21}$ atoms/cm$^2$, a range of $10^{19}$ to $10^{21}$ atoms/cm$^2$, or a range of $10^{20}$ to $10^{21}$ atoms/cm$^2$. In an example, the space oxide include $^{10}$B in an amount in a range of $2 \times 10^{20}$ to $5 \times 10^{20}$ atoms/cm$^2$. The spacer oxide 452 can be similarly implanted or can be free of boron.

Figure 6:
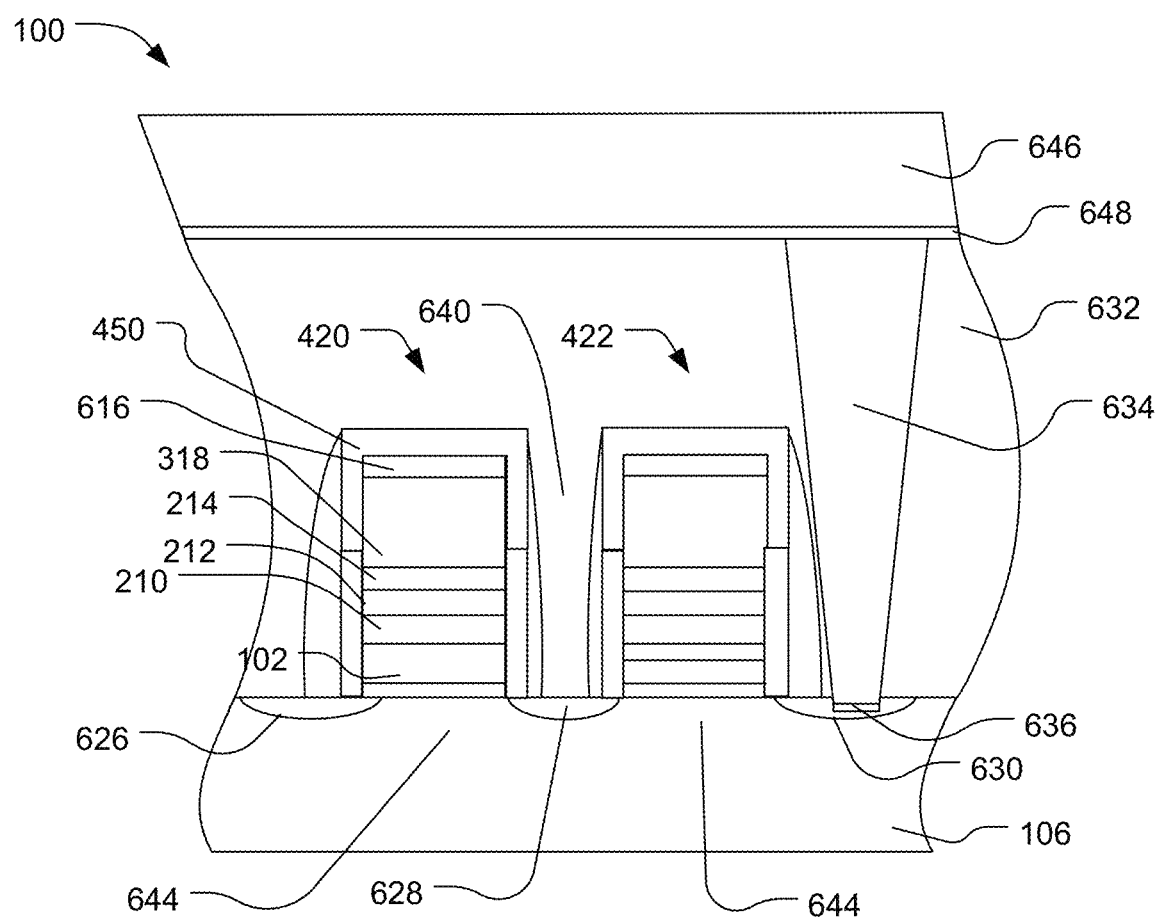
FIG. 6 includes an illustration of example portions of a detection device.

FIG. 6 includes an illustration of a portion of a detection array. In particular, the array includes a plurality of gate structures, such as gate structures 420 and 422. The semiconductor substrate 106 includes a well source/drain 628 disposed between the gate stacks 620 and 622. In addition, source/drains 626 or 630 are formed within the semiconductor substrate 106 on opposite sides of the gate stacks 420 and 422 from the source/drain 628.

Using masking and ion implantation techniques, source/drains 626, 628, and 630 can be formed within the semiconductor layer 106 adjacent or between the gate stacks 420 or 422. The source/drains 626, 628, and 630 can be implanted before forming the layers of the gate stacks 420 or 422. Alternatively, the source/drain implants can be formed after etching the gate structures. The type of source/drain region depends on the nature of the substrate or regions within which the source/drains are formed. For example, a p-type source/drain can be formed using a boron ion implantation in an n-type substrate or region. Alternatively, source/drains of n+ type material can be formed in a p-type region. The n+ type source/drains can be formed using arsenic, phosphorous, or other similar dopants using ion implantation. Accordingly, a gate region 644 extends between the source/drains. While P-MOS transistors are described, N-MOS transistors can be formed using a similar method having a similar gate stack structure.

Sidewall spacers 640 that isolate the gate stacks can be formed of a nitride material, such as a silicon nitride. Optionally, spacer oxides 450 or 452 can be formed on the sides of the gate stacks 420 and 422.

Optional silicide layers can be formed to provide contacts for the gate stack or provide a contact with source/drain regions, such as the source/drain region 630. For example, the gate stack can include a silicide layer 616. In another example, a silicide region, such as 636, can be formed over source/drain regions. A silicide forming metal, such as cobalt, nickel, rhenium, ruthenium, palladium, or a combination thereof, can be deposited by sputtering to a thickness in a range of 5 nm to 30 nm, followed by rapid thermal annealing.

Interlayer dielectric 632 can be disposed over the gate stacks 420 and 422 and an interconnect 634 can be formed to contact the silicide layer 636 through the interlayer dielectric 632 while remaining isolated from the gate stack. In particular, the interlayer dielectric 632 can be formed from a radiation reactive material. For example, the radiation reactive material can include an atomic composition that decomposes in response to thermal neutrons and produces an alpha particle. The alpha particle can interact with the charge storage regions of the charge storage structure 220, allowing detection of a radiation event. The radiation reactive material can include a radiation reactive component boron-10 ($^{10}$B), lithium-6 ($^6$Li), cadmium-113 Cd), gadolinium-157 ($^{157}$Gd), uranium-235 ($^{235}$U), or a combination thereof. The radiation reactive material can be an oxide, nitride, carbide, silicide, oxynitride, or a combination thereof including the radiation reactive component. For example, the radiation reactive material can be an oxide of boron, a nitride of boron, or a carbide of boron. In a particular example, the radiation reactive material is an oxide of boron, such as $B_2O_3$.

The radiation reactive material can include the radiation reactive component (e.g., a radiation reactive isotope of an element) along with non-radiation reactive isotopes of the element. In an example, the radiation reactive component is included in an enriched amount of at least 50%, expressed as a percentage of atoms relative to the total of all the isotopes of the related element. For example, the radiation reactive component can be included in an amount of at least 70%, such as at least 80%, or even at least 90%, such as approximately 100%. In a particular example, the radiation reactive material includes boron-10 in an amount of at least 50%, such as at least 70%, at least 80%, at least 90% or at least 99%.

One of more conductive layers 646 can be formed of a conductive material and disposed over the interlayer dielectric 632 and can be used to form lines, such as bit lines and word lines in electrical contact with the interconnect 634. Optionally, a barrier layer 648 can be formed between the conductive layer 646 and the interlayer dielectric 632.

The interconnect 634 can be formed of a conductive metal such as tungsten, titanium, copper, aluminum, an alloy thereof, or a combination thereof or other conductive materials such as titanium nitride. Optionally, a thin barrier metal layer (not shown) is deposited using sputtering or thermal CVD and including, for example, tantalum, titanium, titanium nitride, or any combination thereof. In an example, tungsten can be deposited to form the interconnect using a thermal LPCVD. Additional metallization layers and packaging can be performed to complete the electronic component.

Figure 7:
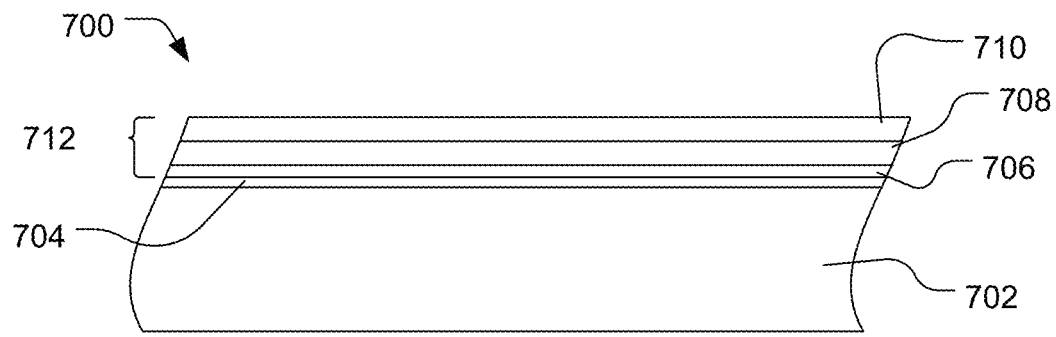
FIG. 7, FIG. 8, and FIG. 9 include illustrations of example workpieces for forming an embodiment of a detection device.

In a further example, a radiation detection device can be formed with the charge carrying structure disposed proximal to the substrate. For example, as illustrated in FIG. 7, an optional oxide layer 704, such as a silicon oxide, can be disposed over a substrate 702. In an example, the oxide layer includes a native oxide or thin oxide layer that can be optionally removed before formation of the device. Source/drain line implants can optionally be formed in the substrate prior to the deposition of the oxide layer 704.

The charge carrying structure 712 can be formed over the substrate 702 and optional oxide layer 704. For example, the charge carrying structure 712 includes silicon oxide layer 706, a silicon nitride layer 708, and further silicon oxide layer 710. The charge storage structure 712 can have a thickness in a range of 10 nm to 50 nm, such as a range of 10 nm to 30 nm. In particular, the silicon oxide layer 706 can have a thickness in a range of 0.5 nm to 5 nm, such as a range of 1 nm to 4 nm, or even a range of 1 nm to 3 nm. The nitride layer 708 can have a thickness in a range of 3 nm to 10 nm, such as a range of 3 nm to 7 nm, or even a range of 4 nm to 6 nm. In a further example, the oxide layer 710 can have a thickness in a range of 2 nm to 20 nm, such as a range of 3 nm to 15 nm, or even a range of 5 nm to 10 nm.

Figure 8:
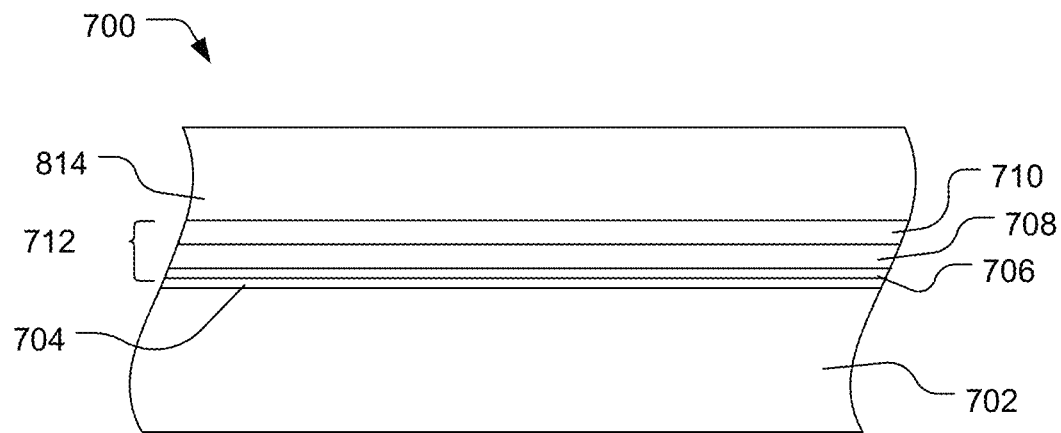

As illustrated in FIG. 8, a gate electrode layer can be disposed over the charge carrying structure 712. For example, a polysilicon layer 814 can be disposed over the charge carrying structure 712. Alternatively, a conductive material such as a metal, for example, titanium, copper, aluminum, or the like, or any combination thereof, can form layer 814.

Figure 9:
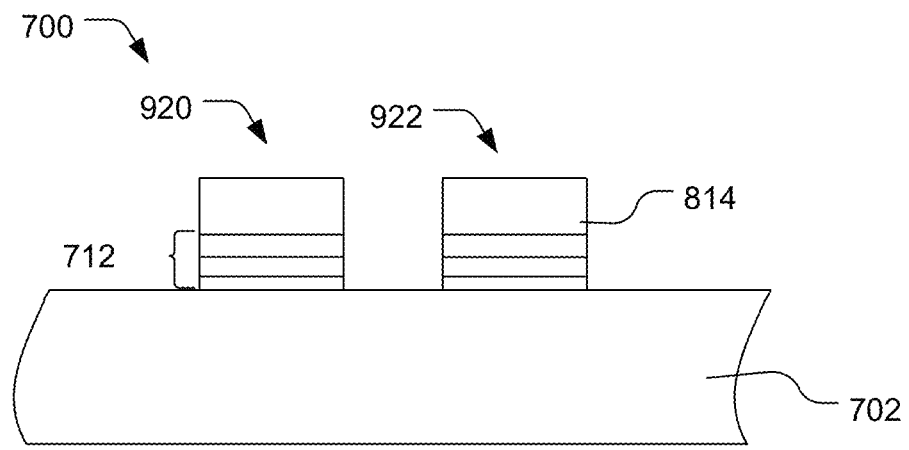

As illustrated in FIG. 9, the layers can be etched to form gate structures 920 and 922. Source/drain implants can be formed, optional silicon dioxide sidewalls can be formed, optional sidewall spacers can be added, and silicide connections can be formed. As above, a sidewall can be formed of a doped oxide of silicon. In another example, a silicide 1016 (FIG. 10) can be formed over the gate 814.

Figure 10:
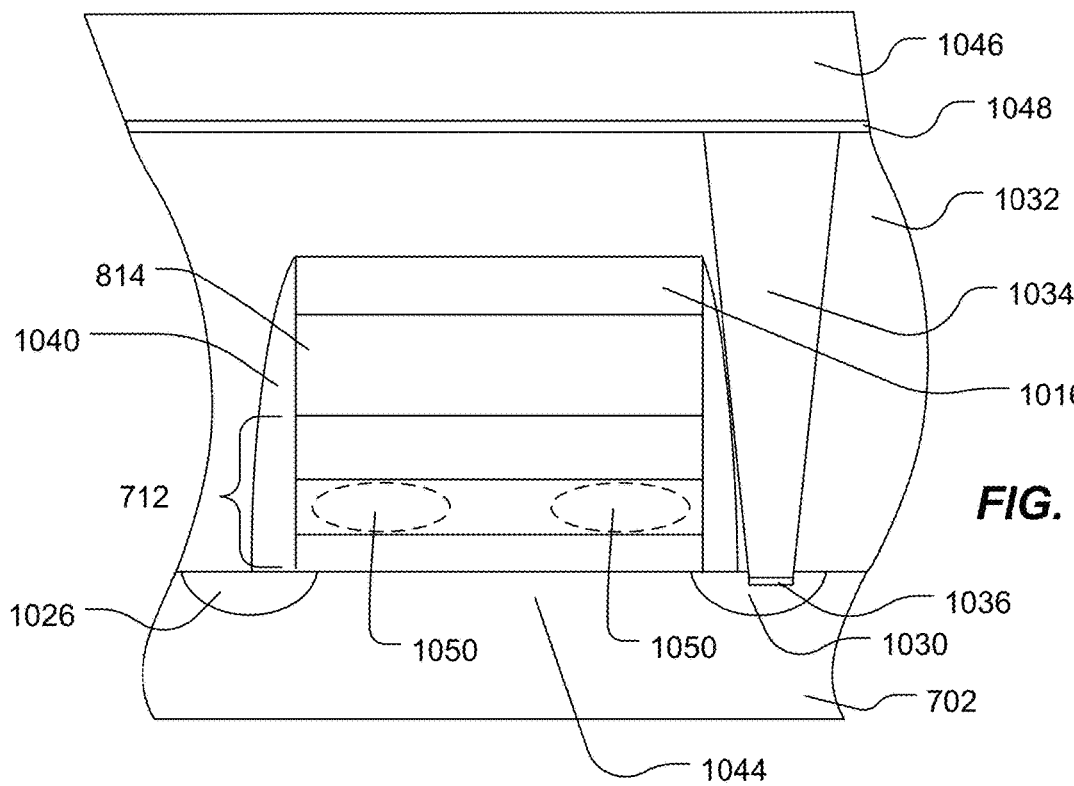
FIG. 10 and FIG. 11 include illustrations of example portions of a detection device.

FIG. 10 includes an illustration of a portion of further embodiment of a detection device. In particular, the radiation detection device includes a single gate stack structure. The nature of the charge storage structure within the radiation detection device can include two charge storage regions 1050 within the silicon nitride layer 708 of the charge storage device 712. With reversible source/drains, the two charge storage regions 1050 can be programmed and read.

For example, the semiconductor substrate 702 is a p-type substrate that includes n+ type source/drains 1026 or 1030 formed within the semiconductor substrate 702 on opposite sides of the gate stack (e.g., gate stacks 920 or 922). Using masking and ion implantation techniques, source/drain regions 1026 or 1030 of n+ type material can be formed adjacent the gate stack. The n+ type drain regions 1026 or 1030 can be formed using arsenic, phosphorous, or other similar dopants using ion implantation. Accordingly, a gate region 1044 extends between the source/drain regions. While P-MOS transistors are described, N-MOS transistors can be formed using a similar method having a similar gate stack structure.

Optionally, spacer oxides, such as oxides of silicon including doped oxides of silicon, can be formed on the sides of the gate stacks. Sidewall spacers 1040 that isolate the gate stacks can be formed of a nitride material, such as a silicon nitride.

Optional silicide layers can be formed to provide contacts for the gate stack or provide a contact with source/drain regions, such as the source/drain region 1026 or 1030. For example, a gate silicide 1016 can be formed over the gate polysilicon 814. In an example, a silicide forming metal, such as cobalt, nickel, rhenium, ruthenium, palladium, or a combination thereof, can be deposited by sputtering to a thickness in a range of 5 nm to 30 nm, followed by rapid thermal annealing.

An interlayer dielectric 1032 can be disposed over the gate stacks, for example, surrounding at least three sides of the gate stacks. In particular, the interlayer dielectric 1032 can be formed from a radiation reactive material. For example, the radiation reactive material can include an atomic composition that decomposes in response to thermal neutrons and produces an alpha particle. The alpha particle can interact with the charge storage regions 1050 of the charge storage structure 712, allowing detection of a radiation event. The radiation reactive material can include a radiation reactive component boron-10 ($^{10}B$), lithium-6 ($^{6}Li$), cadmium-113 ($^{113}Cd$), gadolinium-157 ($^{157}Gd$), uranium, or a combination thereof. The radiation reactive material can be an oxide, nitride, carbide, silicide, oxynitride, or a combination thereof including the radiation reactive component. For example, the radiation reactive material can be an oxide of boron, a nitride of boron, or a carbide of boron. In a particular example, the radiation reactive material is an oxide of boron, such as $B_2O_3$.

The radiation reactive material can be formed using chemical vapor deposition (CVD), low pressure chemical vapor deposition (LPCVD), plasma enhanced chemical vapor deposition (PECVD), other techniques, or any combination thereof.

The radiation reactive material can include the radiation reactive component (e.g., a radiation reactive isotope of an element) along with non-radiation reactive isotopes of the element. In an example, the radiation reactive component is included in an enriched amount of at least 50%, expressed as a percentage of atoms relative to the total of all the isotopes of the related element. For example, the radiation reactive component can be included in an amount of at least 70%, such as at least 80%, or even at least 90%, such as approximately 100%. In a particular example, the radiation reactive material includes boron-10 in an amount of at least 50%, such as at least 70%, at least 80%, at least 90% or at least 99%.

An interconnect 1034 can be formed to contact the silicide layer 1036 through the interlayer dielectric 732 while remaining isolated from the gate stack. One or more metal layers 746 can be formed of a conductive materials and disposed over the interlayer dielectric 732 and can provide word lines and bit lines in electrical contact with interconnects, such as the interconnect 734, to access source/drains or gates. Optionally, a barrier layer 1048 can be formed between the metal layer 1046 and the interlayer dielectric 1032.

The interconnect 1034 can be formed of a conductive metal such as tungsten, titanium, copper, aluminum, an alloy thereof, or a combination thereof or other conductive materials, such as titanium nitride. Optionally, a thin barrier metal layer 1048 is deposited using sputtering or thermal CVD and including for example, tantalum, titanium, titanium nitride, or any combination thereof. In an example, tungsten can be deposited to form the interconnect using a thermal LPCVD. Additional metallization layers and packaging can be performed to complete the electronic component.

Figure 11:
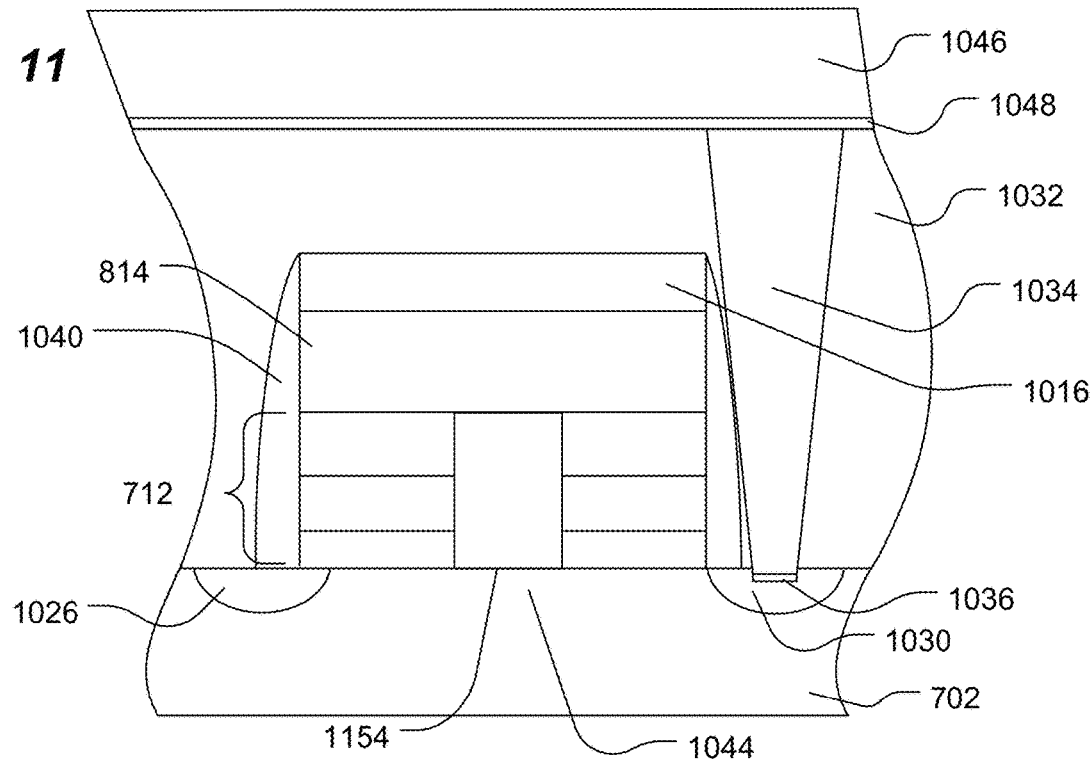

FIG. 11 includes an illustration of a further embodiment of a detection device. An isolation block 1154 is formed to at least electrically isolate parts of the oxide-nitride-oxide stack 712, including layers 706, 708, and 710. While isolation block 1154 is illustrated as extending the height of the charge storage structure 712, the isolation block 1154 can optionally extend into or through the semiconductor layer 814. In an example, the isolation block 1154 can be formed of an oxide of silicon.

Figure 12:
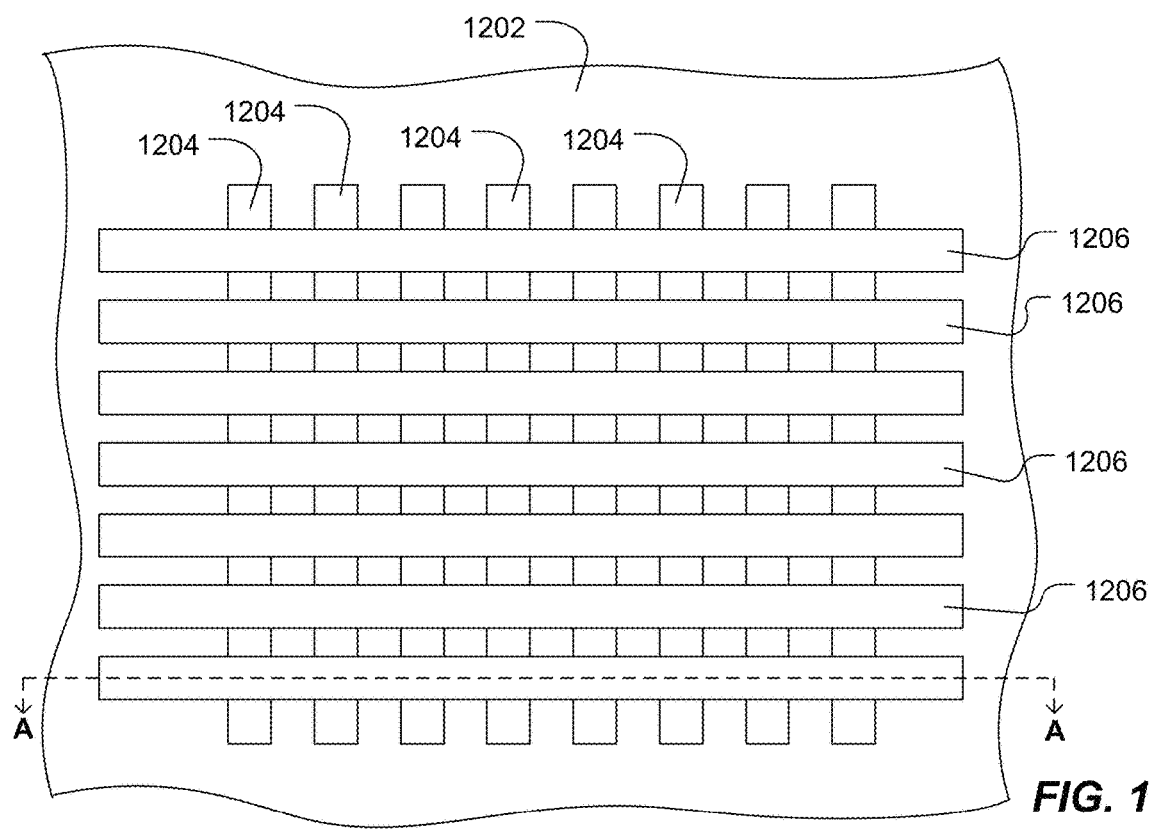
FIG. 12 includes a plan-view illustration of an example detection device array.

While FIG. 10 and FIG. 11 illustrate an embodiment of an example radiation detection device, source/drain implants can be formed as a line within the substrate or polysilicon perpendicular to the gate stack formed over the substrate. For example, FIG. 12 illustrates a plan view of a substrate 1202 in which source/drain implant lines 1204 are formed. The gate stacks 1206, including the charge storage layers, are formed over the substrate 1202 and perpendicular to the source/drain implant lines 1204.

Figure 13:
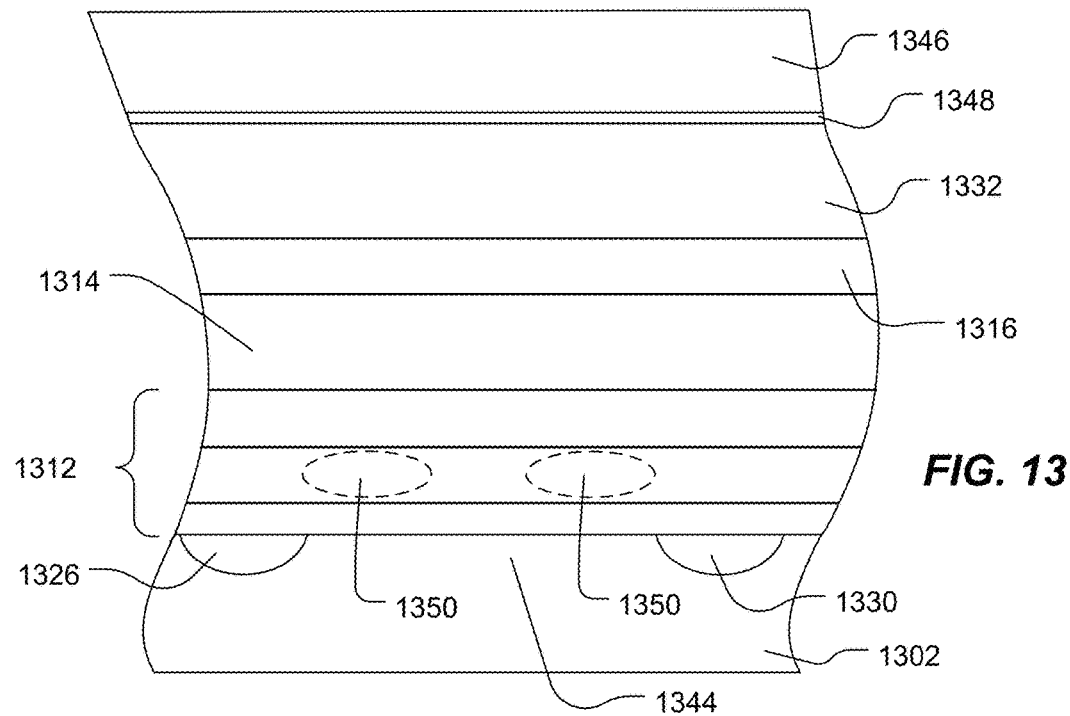
FIG. 13 and FIG. 14 include illustrations example portions of a detection device.

When viewed in cross-section perpendicular to the source/drain implant lines 1204, for example, at cut A, the gate stack would be illustrated as extending across the illustration. For example, as illustrated in FIG. 13, a single gate stack structure can be used to form a plurality of radiation detection devices between adjacent source/drain implant lines.

In particular, the radiation detection device is formed using the gate stack structure. The nature of the charge storage structure within the radiation detection device can include two charge storage regions 1350 within the silicon nitride layer of the charge storage device 1312. With reversible source/drains, the two charge storage regions 1350 can be programmed and read for each radiation detection device formed along the length of the gate stack structure.

For example, the semiconductor substrate 1302 is a p-type substrate that includes n+ type source/drains 1326 or 1330 formed within the semiconductor substrate 1302 running perpendicular to the gate stack. Using masking and ion implantation techniques, source/drain regions 1326 or 1330 of n+ type material can be formed within the substrate 1302 prior to forming the gate stack. The n+ type drain regions 1326 or 1330 can be formed using arsenic, phosphorous, or other similar dopants using ion implantation. Accordingly, a gate region 1344 extends between the source/drain regions. While P-MOS transistors are described, N-MOS transistors can be formed using a similar method having a similar gate stack structure.

Optionally, spacer oxides, such as oxides of silicon including doped oxides of silicon, can be formed on the sides of the gate stacks. Sidewall spacers that isolate the gate stacks can be formed of a nitride material, such as a silicon nitride.

Optional silicide layers can be formed to provide contacts for the gate stack or provide a contact with source/drain regions, such as the source/drain region 1326 or 1330. For example, a gate silicide 1316 can be formed over the gate polysilicon 1314. In an example, a silicide forming metal, such as cobalt, nickel, rhenium, ruthenium, palladium, or a combination thereof, can be deposited by sputtering to a thickness in a range of 5 nm to 30 nm, followed by rapid thermal annealing.

An interlayer dielectric 1332 can be disposed over the gate stacks and surround the gate stacks on at least three sides. In particular, the interlayer dielectric 1332 can be formed from a radiation reactive material. For example, the radiation reactive material can include an atomic composition that decomposes in response to thermal neutrons and produces an alpha particle. The alpha particle can interact with the charge storage regions 1350 of the charge storage structure 1312, allowing detection of a radiation event. The radiation reactive material can include a radiation reactive component boron-10 ($^{10}$B) lithium-6 ($^6$Li), cadmium-113 ($^{113}$Cd), gadolinium-157 ($^{157}$Gd), uranium, or a combination thereof. The radiation reactive material can be an oxide, nitride, carbide, silicide, oxynitride, or a combination thereof including the radiation reactive component. For example, the radiation reactive material can be an oxide of boron, a nitride of boron, or a carbide of boron. In a particular example, the radiation reactive material is an oxide of boron, such as $B_2O_3$.

The radiation reactive material can be formed using chemical vapor deposition (CVD), low pressure chemical vapor deposition (LPCVD), plasma enhanced chemical vapor deposition (PECVD), other techniques, or any combination thereof.

The radiation reactive material can include the radiation reactive component (e.g., a radiation reactive isotope of an element) along with non-radiation reactive isotopes of the element. In an example, the radiation reactive component is included in an enriched amount of at least 50%, expressed as a percentage of atoms relative to the total of all the isotopes of the related element. For example, the radiation reactive component can be included in an amount of at least 70%, such as at least 80%, or even at least 90%, such as approximately 100%. In a particular example, the radiation reactive material includes boron-10 in an amount of at least 50%, such as at least 70%, at least 80%, at least 90% or at least 99%.

One or more metal layers 1346 can be formed of a conductive materials and disposed over the interlayer dielectric 1332 and can provide word lines and bit lines in electrical contact with interconnects, such as the interconnect 1334, to access source/drains or gates. Optionally, a barrier layer 1348 can be formed between the metal layer 1346 and the interlayer dielectric 1332.

Figure 14:
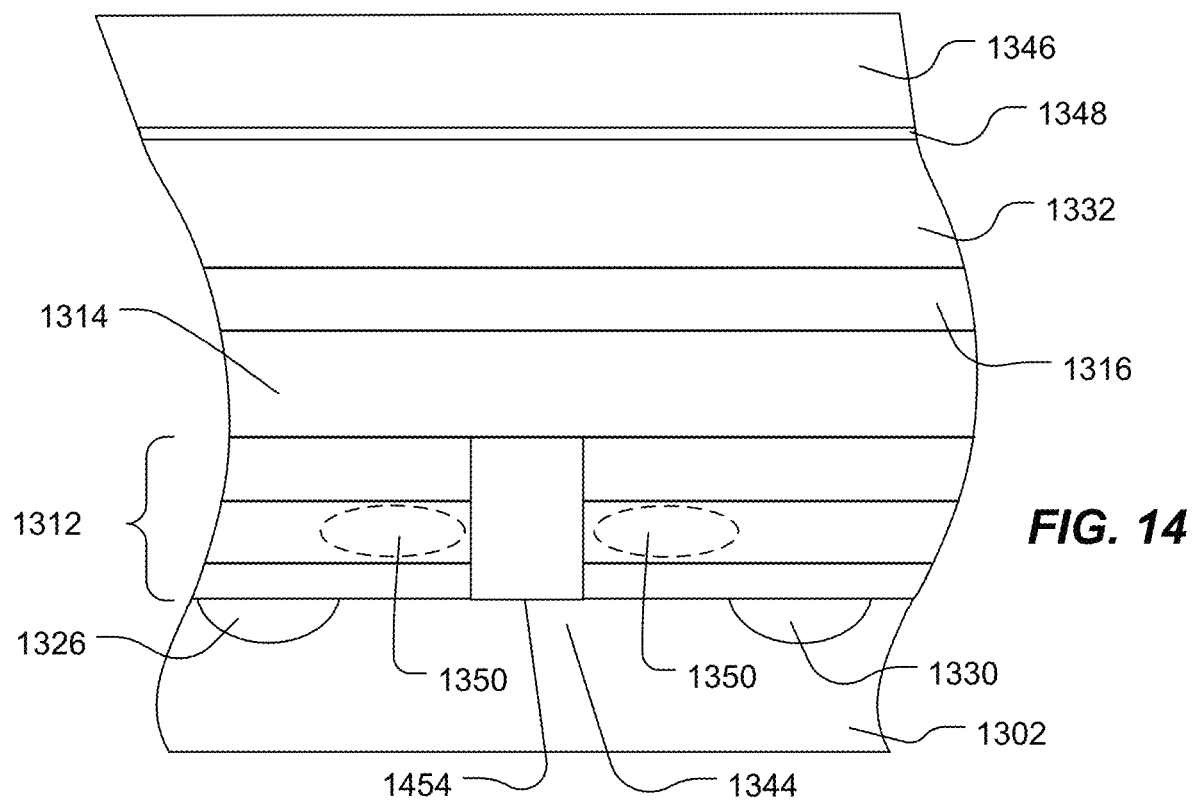

FIG. 14 includes an illustration of a further embodiment of a detection device. An isolation block 1454 is formed to at least electrically isolate parts of the oxide-nitride-oxide stack 1312. In this embodiment, the isolation block extends perpendicular to the gate stack and parallel to the source/drain lines. While the isolation block 1454 is illustrated as extending the height of the charge storage structure 1312, the isolation block 1454 can optionally extend into or through the semiconductor layer 1314. In an example, the isolation block 1354 can be formed of an oxide of silicon.

Figure 15:
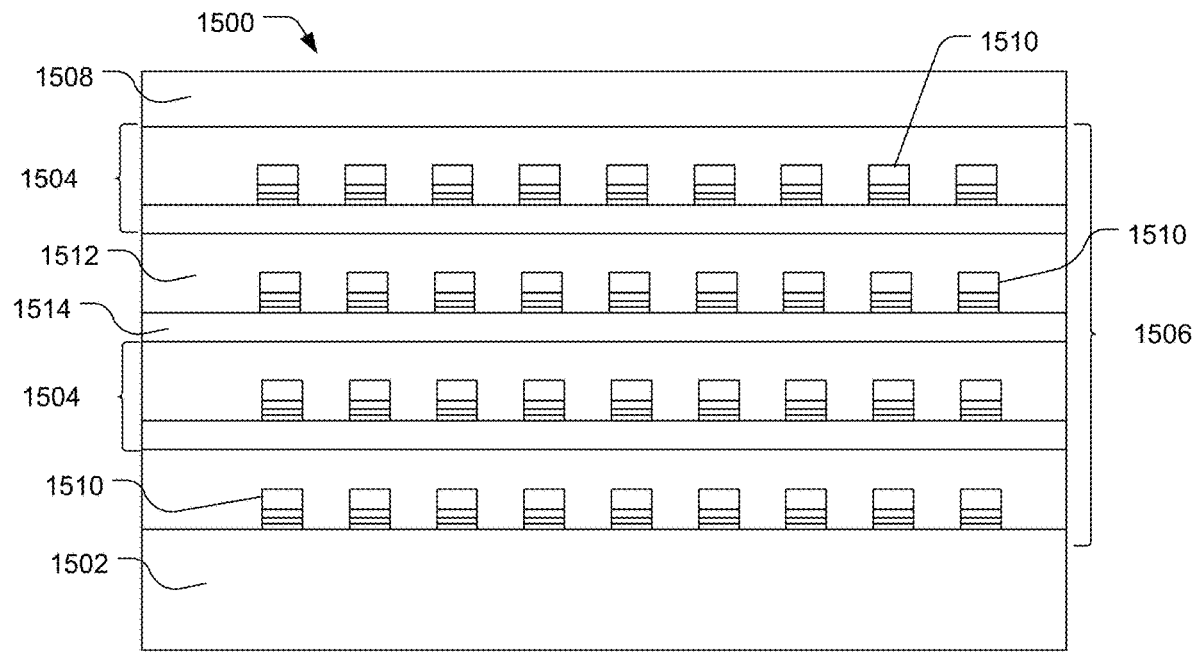
FIG. 15 and FIG. 16 include illustrations of an example portion of a detection system.

In a further example illustrated in FIG. 15, the system 1500 can include a plurality of arrays stacked on top of one another. For example, the arrays 1504 of radiation detection device 1510 can be formed over the substrate 1502. Each of the arrays 1504 includes an array of gate stacks of the detection devices 1510 formed over a polysilicon layer 1514 and surrounded on three sides with a radiation reactive material 1512. The arrays 1504 are then formed on top of one another to form a stack 1506. The stack 1506 can include at least two layers, such as between 3 and 100 layers, such as 3 to 50 layers, or 3 to 10 layers. The polysilicon layer 1514 can have a thickness in a range of 50 nm to 1 micrometer, such as a thickness in a range of 50 nm to 500 nm, or a thickness in a range of 100 nm to 500 nm.

For example, after a lower array is formed, a further polysilicon layer can be deposited over the radiation reactive material and an additional set of gate stacks can be formed over the polysilicon layer. The gate stacks are then surrounded by the radiation reactive material and a further polysilicon layer can be deposited above the radiation reactive layer. One or more metal layers 1508 can be formed over the stack 1506 and interconnects can be formed as the stack is formed to connect with the metal connections of the metal layers 1508. In particular, each of the radiation detection devices 1510 can be configured to form two charge carrying regions.

Figure 16:
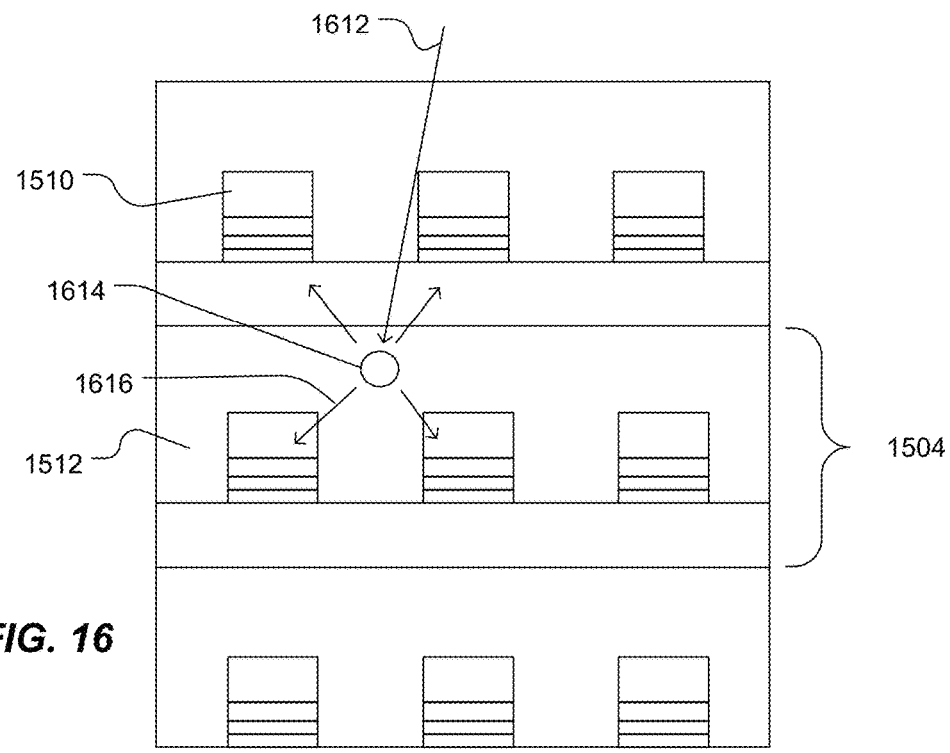

The stacking of layers provides for a greater likelihood that a neutron entering the system will interact with the nucleus of an atom within the radiation reactive material. Furthermore, when that interaction occurs, there is a greater likelihood that an alpha particle omission will traverse a charge carrying region of a radiation detection device. For example, as illustrated in FIG. 16, when a thermal neutron 1612 enters the system, it may interact with the nucleus of an atom 1614 within one of the radiation reactive material layer of one of the arrays 1504, resulting in an alpha particle 1616 emission. There is a greater likelihood that the alpha particle will traverse toward a charge carrying region of a radiation detection device when the device has a stack configuration. As such, there is a greater likelihood that the thermal neutron is detected.

In an example, each radiation detection device on each array within the stack can be individually addressable. Further, each source/drain can be individually addressable and optionally reversible, permitting measurement and storage of charge within two regions of each radiation detection device. For example, the system can include a word line for each gate structure and a bit line for each row of source/drains for each array within the stack of arrays.

Figure 17:
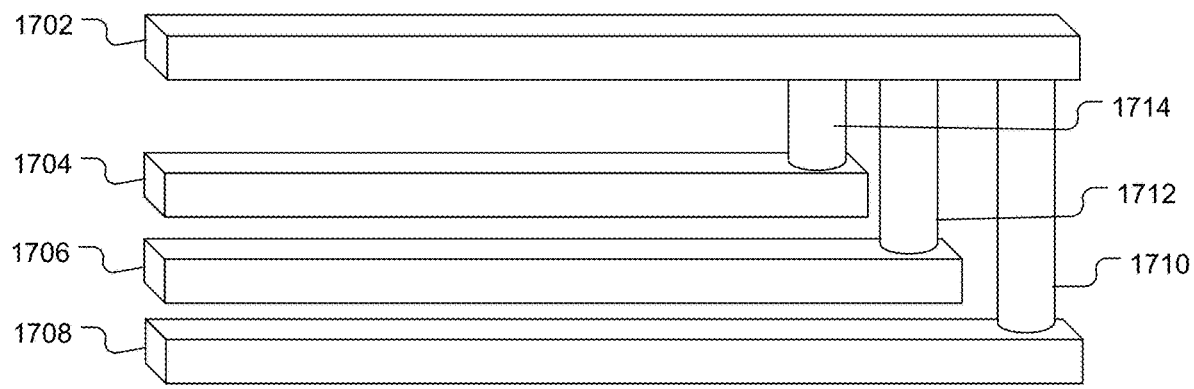
FIG. 17 includes an illustration of an example configuration of circuitry for a detection system.

In another example, a single word line can attached to a gate in each stack. For example, as illustrated in FIG. 17, a word line 1702 can be connected to a gate in each of the illustrated three vertically stacked arrays. For example, the word line 1702 can be connected to a gate 1704 using an interconnect 1714 in an upper array, can be connected by an interconnect 1712 to a gate 1706 in a middle array, and can be connected using an interconnect 1710 to a gate 1708 in a lower array of the stack. Each device on each layer can still be individually addressable based on activation of the source/drains. Alternatively, a bit line for a source/drain can be connected to a row of source/drains in each of the stacks. Word lines uniquely associated with each gate of each array can be used to individually address each of the radiation reactive devices.

Figure 18:
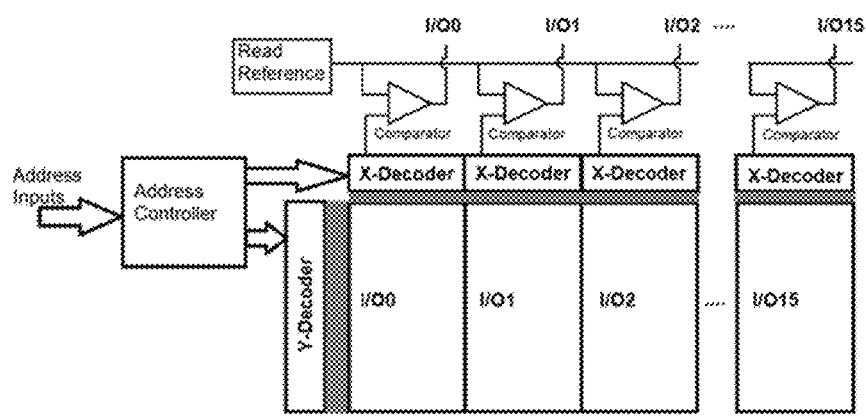
FIG. 18 includes an illustration of example circuitry for detecting radiation events.

Turning to FIG. 18, accessing the radiation detectors can be performed using methods similar to accessing memory. The array of radiation detectors can be logically separated into bit regions, each having an associated X-decoder. A single Y-decoder can be used for the bit regions and can activate word lines extending across bit regions. An address controller can directly the actions of a word line extending across the bit regions and a pair of source/drains for each of the X-decoders of each bit region. Outputs from each of the bits can be compared to a read reference, for example using a comparator, to provide results. In the case of a stack configuration, each stack can have a Y-decoders and a set of X-decoders. Alternatively, a single Y-decoder can be used for all of the stacks with a configuration in which a single word line can activate a gate on each of the stacks. Alternatively, space can be saved in the stack configuration by providing a Y-decoder for each of the arrays in the stack and using a single set of X-decoders for all of the stacks.

By being individually addressable, the system can provide a degree of spatial granularity. In an example, the system can be used for imaging in which the arrays of detection device provide approximate spatial indication of the direction from which a detected neutron emanated. As such, each device with the stack of arrays can be read to determine whether an event was detected and the address and state of each can be used to form an image.

Alternatively, the system can be set up to provide an indication as to whether radiation is present or provide a number of events that have occurred on the system. In such a case, the state of each radiation detection device within the within each array of the stack is less relevant to an end user. Instead, a summary of the number of detected events provides an indication as to whether radiation source is present or the radioactivity of such a source. As such, the system can test the value of each word to determine whether an event has occurred. The value of the word, along with other values of other words can be used to determine a number of detected events and a likelihood that a radiation source is present.

Figure 19:
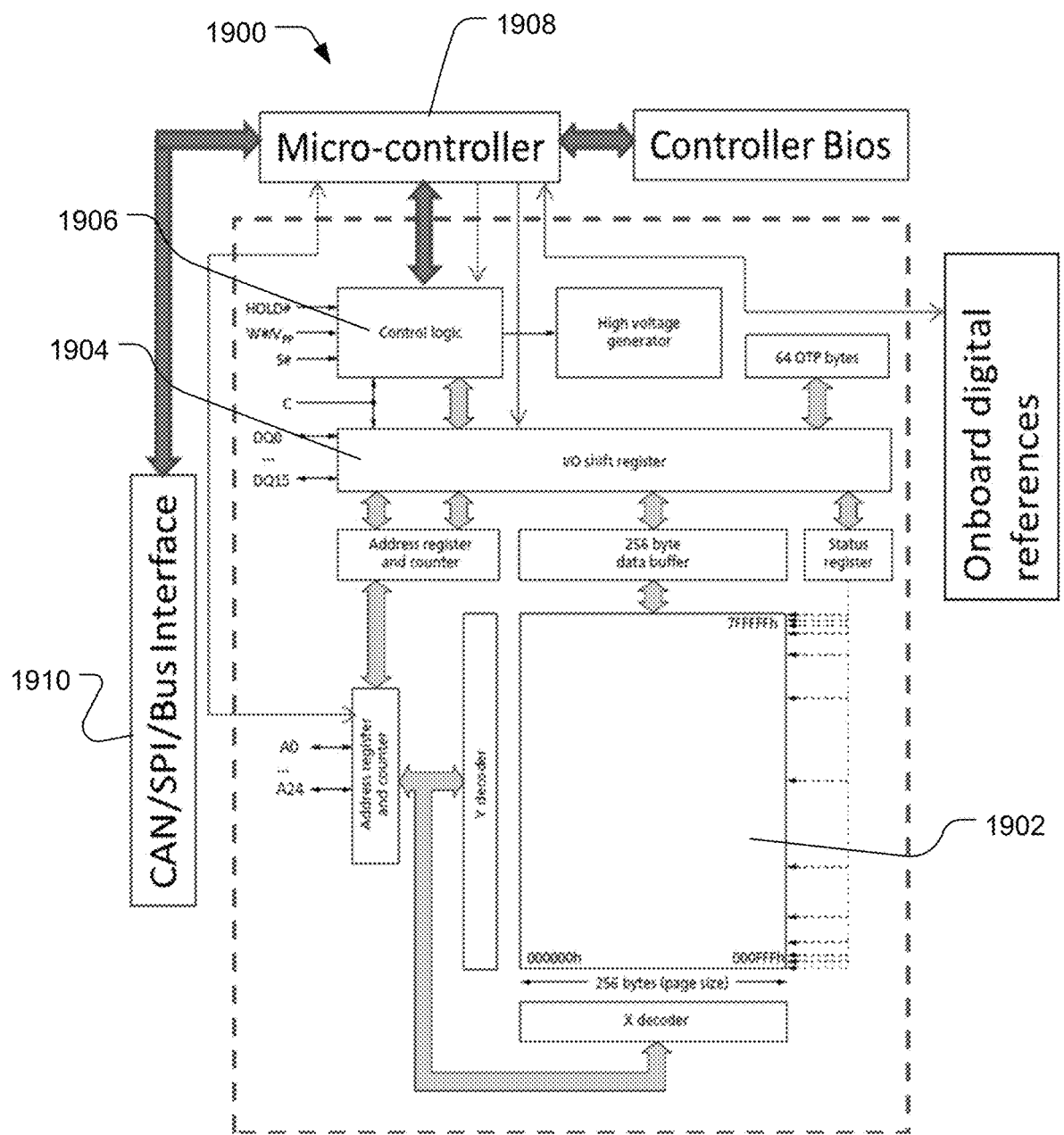
FIG. 19 includes an illustration of an exemplary detection system.

FIG. 19 includes an illustration of an example detection system 1900. A detector array 1902 or stack of arrays, including devices, such as those described above, is connected to circuitry for addressing and reading components of the array 1902. The circuitry can include an I/O shift register 1904 and control logic 1906. The system can further include a microcontroller 1908 in communication with the control logic 1906 and can include interfaces, such as a bus interface 1910 in communication with the microcontroller 1908.

When the detector array 1902 includes devices having two charge storage regions and the source/drain can be reversed, i.e., function as a source at one time and function as a drain at another time, both charge storage regions can be read. When the charge in one storage region is high and the adjacent source/drain is a source, current through the device will be lower, referred to herein as the "0" state. When the charge in the storage region is below a threshold and the adjacent source/drain is a source, current will pass through the device, referred to herein as the "1" state.

In particular, embodiments of the above described electronic devices provide technical advantages including high sensitivity to neutron radiation.

In an first aspect, a radiation detector includes a semiconductor substrate; a radiation detection stack comprising a plurality of arrays of radiation detection devices, each array of the plurality of arrays of radiation detection devices including a set of gate stacks disposed over a plurality of source/drain regions, each gate stack of the set of gate stacks including a gate layer disposed adjacent a charge storage structure, each array including an interlayer dielectric formed of a radiation reactive material, the interlayer dielectric surrounding the set of gate stacks on at least three sides; and a plurality of metal structures disposed over the radiation detection stack, the metal structures defining a set of word line and a set of bit lines.

In an example of the first aspect, a word line of the set of word lines is in electrical communication with a gate from each array of the plurality of arrays. For example, the source/drain regions are arranged in rows and each row of source/drain regions is uniquely in electrical communication with a bit line.

In another example of the first aspect and the above examples, a bit line of the set of bit lines is in electrical communication with a row of the plurality of source/drain regions in each array of the plurality of arrays. For example, each gate layer of the set of gate stacks of each array is uniquely in electrical communication with a word line.

In a further example of the first aspect and the above examples, the radiation reactive material includes a radiation reactive component selected from boron-10 (10B), lithium-6 (6Li), cadmium-113 (113Cd), gadolinium-157 (157Gd), uranium, and a combination thereof. For example, the radiation reactive material includes at least 50% of the radiation reactive component. In another example, the radiation reactive material includes at least 80% of the radiation reactive component. In a further example, the radiation reactive material includes an oxide, nitride, oxynitride, or carbide of the radiation reactive component. In an additional example, the radiation reactive material includes an oxide, nitride, oxynitride, or carbide of boron-10. For example, the radiation reactive material includes an oxide of boron-10.

In an additional example of the first aspect and the above examples, the charge storage structure includes an oxide of silicon disposed over a nitride of silicon disposed over an oxide of silicon.

In another example of the first aspect and the above examples, the charge storage structure includes two charge storage regions within the nitride of silicon.

In a second aspect, a radiation detector includes a semiconductor layer comprising first and second source/drain regions and a gate region disposed between the source/drain regions; a gate stack disposed over the gate region of the semiconductor layer, the gate stack including a gate layer disposed adjacent a charge storage structure; and a radiation reactive structure disposed around the gate stack and surrounding the gate stack on at least three sides, the radiation reactive structure formed of a radiation reactive material.

In an example of the second aspect, the radiation reactive material includes a radiation reactive component selected from boron-10 (10B), lithium-6 (6Li), cadmium-113 (113Cd), gadolinium-157 (157Gd), uranium, and a combination thereof. For example, the radiation reactive material includes at least 50% of the radiation reactive component. In another example, the radiation reactive material includes at least 80% of the radiation reactive component. In a further example, the radiation reactive material includes an oxide, nitride, oxynitride, or carbide of the radiation reactive component. In an additional example, the radiation reactive material includes an oxide, nitride, oxynitride, or carbide of boron-10. For example, the radiation reactive material includes an oxide of boron-10.

In another example of the second aspect and the above examples, the charge storage structure includes two charge storage regions.

In a further example of the second aspect and the above examples, the charge storage structure includes an oxide of silicon disposed over a nitride of silicon disposed over an oxide of silicon. For example, the charge storage structure includes two charge storage regions within the nitride of silicon.

In a third aspect, a method of forming a radiation detector includes forming a stack including a plurality of arrays of radiation detection devices, wherein forming an array of the plurality of arrays includes: forming a polysilicon layer over an interlayer dielectric layer of another array of the plurality of arrays; forming charge storage layers over the polysilicon layer; forming a second polysilicon layer over the charge storage layers; etching the charge storage layers and the second polysilicon layer to form gate stacks; and depositing an interlayer dielectric disposed on at least three sides of the gate stacks, the interlayer dielectric including a radiation reactive material.

In an example of the third aspect, the method further includes forming source/drains in the polysilicon layer prior to depositing the interlayer dielectric.

In another example of the third aspect and the above examples, the method further includes forming a silicide layer over the gate stacks prior to depositing the interlayer dielectric.

In an additional example of the third aspect and the above examples, forming the charge storage layers includes forming a layer of an oxide of silicon, forming a layer of a nitride of silicon on the layer of the oxide of silicon, and forming a second layer of an oxide of silicon.

In another example of the third aspect and the above examples, the layer of the nitride of silicon defines two charge storage regions.

In a further example of the third aspect and the above examples, the radiation reactive material includes a radiation reactive component selected from boron-10 (10B), lithium-6 (6Li), cadmium-113 (113Cd), gadolinium-157 (157Gd), uranium, and a combination thereof. For example, the radiation reactive material includes at least 50% of the radiation reactive component. In another example, the radiation reactive material includes at least 80% of the radiation reactive component. In a further example, the radiation reactive material includes an oxide, nitride, oxynitride, or carbide of the radiation reactive component. In an additional example, the radiation reactive material includes an oxide, nitride, oxynitride, or carbide of boron-10. For example, the radiation reactive material includes an oxide of boron-10.

In a fourth aspect, a method of forming a radiation detector includes forming charge storage layers over a polysilicon layer; forming a second polysilicon layer over the charge storage layers; etching the charge storage layers and the second polysilicon layer to form gate stacks; and depositing an insulative dielectric disposed on at least three sides of the gate stacks, the insulative dielectric including a radiation reactive material.

In an example of the fourth aspect, the method further includes forming source/drains in the polysilicon layer prior to depositing the interlayer dielectric.

In another example of the fourth aspect and the above examples, the method further includes forming a silicide layer over the gate stacks prior to depositing the interlayer dielectric.

In a further example of the fourth aspect and the above examples, forming the charge storage layers includes forming a layer of an oxide of silicon, forming a layer of a nitride of silicon on the layer of the oxide of silicon, and forming a second layer of an oxide of silicon. For example, the layer of the nitride of silicon defines two charge storage regions.

In an additional example of the fourth aspect and the above examples, the radiation reactive material includes a radiation reactive component selected from boron-10 (10B), lithium-6 (6Li), cadmium-113 (113Cd), gadolinium-157 (157Gd), uranium, and a combination thereof. For example, the radiation reactive material includes at least 50% of the radiation reactive component. In another example, the radiation reactive material includes at least 80% of the radiation reactive component. In a further example, the radiation reactive material includes an oxide, nitride, oxynitride, or carbide of the radiation reactive component. In an additional example, the radiation reactive material includes an oxide, nitride, oxynitride, or carbide of boron-10. For example, the radiation reactive material includes an oxide of boron-10.

As used herein, one layer is on or over another layer when the other layer is disposed to have a major surface intersected by a vector normal to a major surface of the one layer. The layer over the one layer can be in direct contact or there can be one or more interceding layers between the layer and the one layer.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciate that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A method of forming a radiation detector, the method comprising:
    forming a stack including a plurality of arrays of radiation detection devices, wherein forming an array of the plurality of arrays includes:
        forming a polysilicon layer over an interlayer dielectric layer of another array of the plurality of arrays;
        forming charge storage layers over the polysilicon layer, wherein forming the charge storage layers includes forming a layer of an oxide of silicon having a thickness in a range of 1 nm to 3 nm directly on the polysilicon layer, forming a layer of a nitride of silicon on the layer of the oxide of silicon, and forming a second layer of an oxide of silicon, wherein the layer of the nitride of silicon defines two charge storage regions;
        forming a second polysilicon layer over the charge storage layers;
        etching the second polysilicon layer to form gate stacks; and
        depositing an interlayer dielectric disposed on at least three sides of the gate stacks, the interlayer dielectric including a radiation reactive material.

2. The method of claim 1, further comprising forming source/drains in the polysilicon layer prior to depositing the interlayer dielectric.

3. The method of claim 1, further comprising forming a silicide layer over the gate stacks prior to depositing the interlayer dielectric.

4. The method of claim 1, wherein the radiation reactive material includes a radiation reactive component selected from boron-10 ($^{10}$B), lithium-6 ($^{6}$Li), cadmium-113 ($^{113}$Cd), gadolinium-157 ($^{157}$Gd), uranium-235 ($^{235}$U), and a combination thereof.

5. The method of claim 4, wherein the radiation reactive material includes at least 50% of the radiation reactive component.

6. The method of claim 5, wherein the radiation reactive material includes at least 80% of the radiation reactive component.

7. The method of claim 4, wherein the radiation reactive material includes an oxide, nitride, oxynitride, or carbide of the radiation reactive component.

8. The method of claim 4, wherein the radiation reactive material includes an oxide, nitride, oxynitride, or carbide of boron-10.

9. The method of claim 8, wherein the radiation reactive material includes an oxide of boron-10.

10. The method of claim 1, wherein the layer of the nitride of silicon has a thickness in a range of 3 nm to 7 nm.

11. The method of claim 1, wherein the second layer of the oxide of silicon has a thickness in a range of 3 nm to 15 nm.

12. The method of claim 1, wherein a single word line connects to a gate in each array of the plurality of arrays.

13. The method of claim 1, wherein a single bit line connects to a source/drain in each array of the plurality of arrays.

14. A method of forming a radiation detector, the method comprising:
- forming charge storage layers over a polysilicon layer, wherein forming the charge storage layers includes forming a layer of an oxide of silicon having a thickness in a range of 1 nm to 3 nm directly on the polysilicon layer, forming a layer of a nitride of silicon on the layer of the oxide of silicon, and forming a second layer of an oxide of silicon, wherein the layer of the nitride of silicon defines two charge storage regions;
- forming a second polysilicon layer over the charge storage layers;
- etching the second polysilicon layer to form gate stacks; and
- depositing an insulative dielectric disposed on at least three sides of the gate stacks, the insulative dielectric including a radiation reactive material.

15. The method of claim 14, further comprising forming source/drains in the polysilicon layer prior to depositing the insulative dielectric.

16. The method of claim 14, further comprising forming a silicide layer over the gate stacks prior to depositing the insulative dielectric.

17. The method of claim 14, wherein the radiation reactive material includes a radiation reactive component selected from boron-10 ($^{10}$B), lithium-6 ($^{6}$Li), cadmium-113 ($^{113}$Cd), gadolinium-157 ($^{157}$Gd), uranium-235 ($^{235}$U), and a combination thereof.

18. The method of claim 17, wherein the radiation reactive material includes at least 50% of the radiation reactive component.

19. The method of claim 17, wherein the radiation reactive material includes an oxide, nitride, oxynitride, or carbide of the radiation reactive component.

20. The method of claim 17, wherein the radiation reactive material includes an oxide, nitride, oxynitride, or carbide of boron-10.

* * * * *